United States Patent
Aoyama et al.

(10) Patent No.: US 7,915,156 B2
(45) Date of Patent: Mar. 29, 2011

(54) SEMICONDUCTOR MEMORY DEVICE AND METHOD FOR MANUFACTURING THE SAME

(75) Inventors: Kenji Aoyama, Yokohama (JP); Eiji Ito, Yokohama (JP); Masahiro Kiyotoshi, Yokkaichi (JP); Tadashi Iguchi, Yokohama (JP); Moto Yabuki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 43 days.

(21) Appl. No.: 12/391,953

(22) Filed: Feb. 24, 2009

(65) Prior Publication Data

US 2009/0212352 A1    Aug. 27, 2009

(30) Foreign Application Priority Data

Feb. 26, 2008    (JP) ................. 2008-044481

(51) Int. Cl.
*H01L 21/336* (2006.01)
(52) U.S. Cl. ................. 438/594; 257/E21.423
(58) Field of Classification Search .............. 257/316, 257/312, 324
See application file for complete search history.

(56) References Cited

U.S. PATENT DOCUMENTS

| | | | |
|---|---|---|---|
| 6,469,339 | B1 | 10/2002 | Onakado et al. |
| 2003/0194853 | A1* | 10/2003 | Jeon ............................. 438/591 |
| 2004/0232496 | A1 | 11/2004 | Chen et al. |
| 2005/0045941 | A1* | 3/2005 | Kurita et al. .................. 257/315 |
| 2006/0001073 | A1 | 1/2006 | Chen et al. |
| 2006/0194390 | A1 | 8/2006 | Imai et al. |
| 2006/0231884 | A1* | 10/2006 | Yonemochi et al. ........... 257/314 |
| 2006/0240619 | A1* | 10/2006 | Ozawa et al. .................. 438/257 |
| 2007/0045711 | A1* | 3/2007 | Bhattacharyya ............... 257/315 |
| 2007/0063256 | A1 | 3/2007 | Imai et al. |
| 2007/0096202 | A1 | 5/2007 | Kang et al. |
| 2007/0184615 | A1* | 8/2007 | Brazzelli et al. .............. 438/266 |
| 2008/0014760 | A1 | 1/2008 | Murata et al. |
| 2009/0001444 | A1* | 1/2009 | Matsuoka et al. ............. 257/316 |

FOREIGN PATENT DOCUMENTS

| | | |
|---|---|---|
| JP | 01-137651 | 5/1989 |
| JP | 2005-044844 | 2/2005 |
| JP | 2006-302950 | 11/2006 |
| JP | 2007-299975 | 11/2007 |

OTHER PUBLICATIONS

Notification of Reasons for Rejection issued by the Japanese Patent Office in Japanese Patent Application No. 2008-044481, mailed Jun. 29, 2010 (6 pages).

A Decision of Final Rejection issued by the Japanese Patent Office in Japanese Patent Application No. 2008-044481, mailed Oct. 22, 2010 (8 pp.).

* cited by examiner

*Primary Examiner* — Benjamin P Sandvik
(74) *Attorney, Agent, or Firm* — Finnegan, Henderson, Farabow, Garrett & Dunner, L.L.P.

(57) ABSTRACT

A semiconductor memory device has a semiconductor substrate, a plurality of word lines formed at predetermined intervals on the semiconductor substrate, each word line having a gate insulating film, a charge storage layer, a first insulating film, and a controlling gate electrode which are stacked in order, and including a metal oxide layer above the level of the gate insulating film, a second insulating film covering a side of the word line and a surface of the semiconductor substrate between the word lines, and having a film thickness of 15 nm or less, and a third insulating film formed between the word lines adjacent to each other such that a region below the level of the metal oxide layer has a cavity.

9 Claims, 8 Drawing Sheets

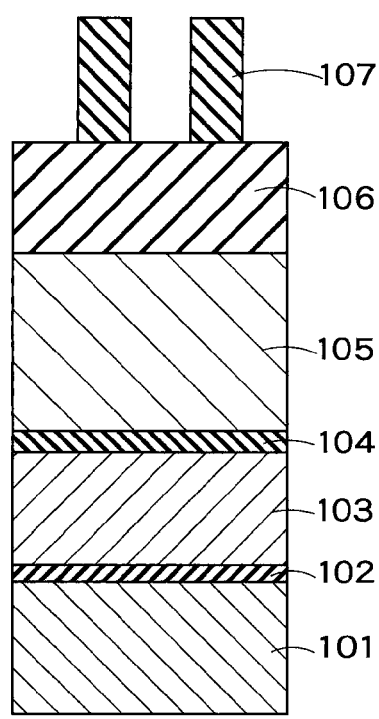
F I G. 1
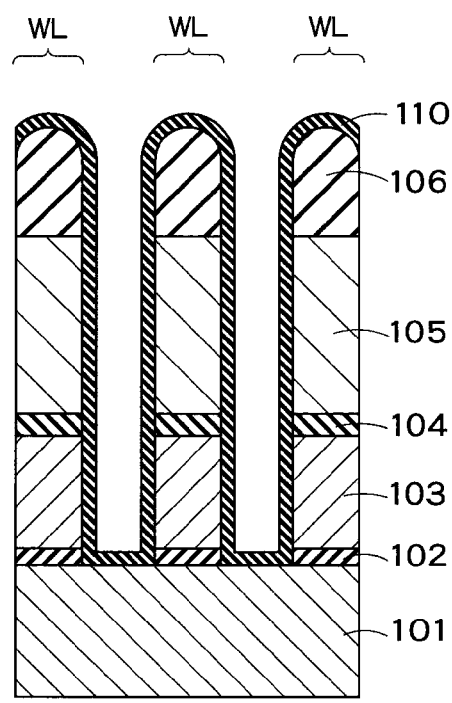
F I G. 2

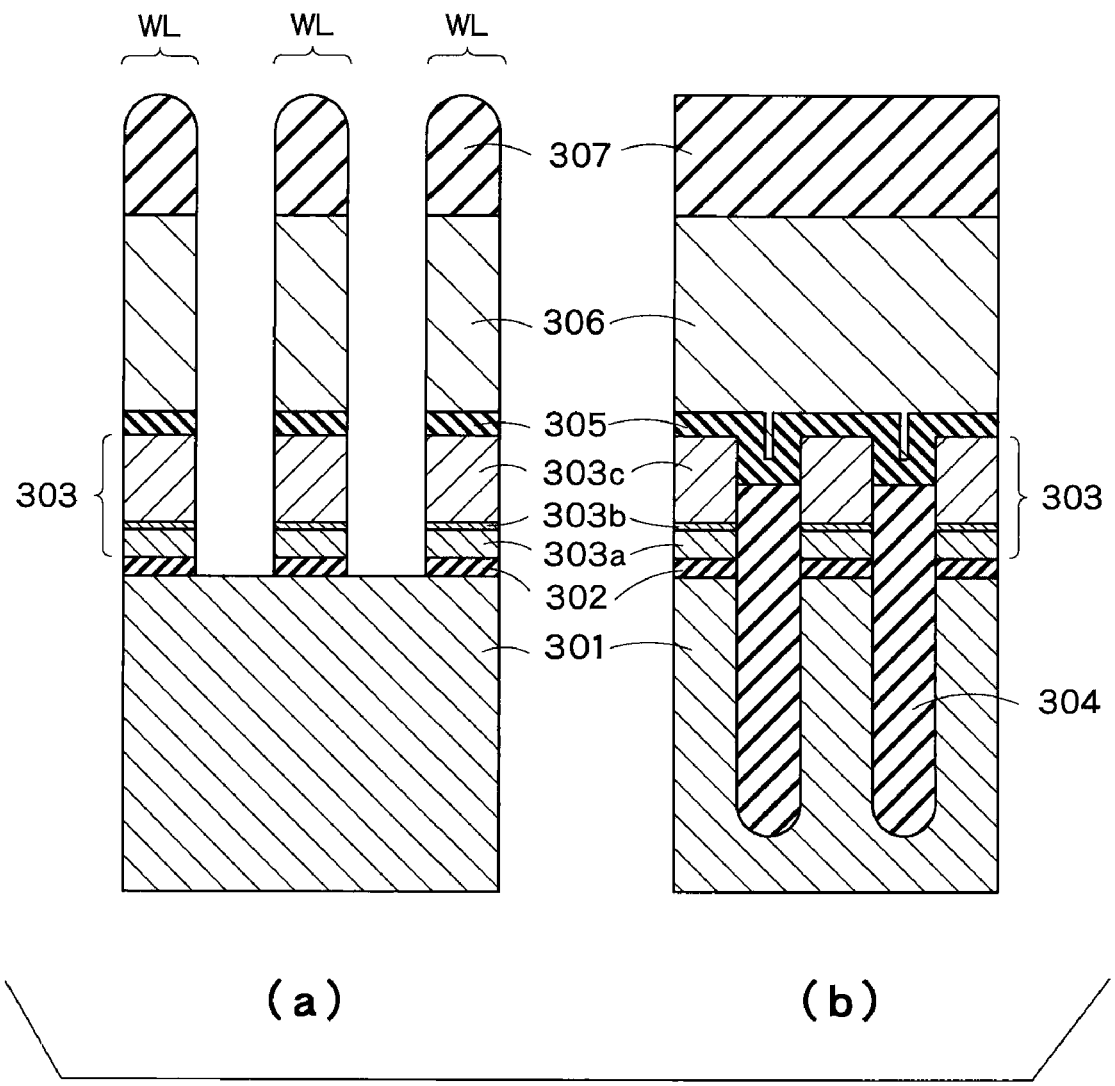
F I G. 8

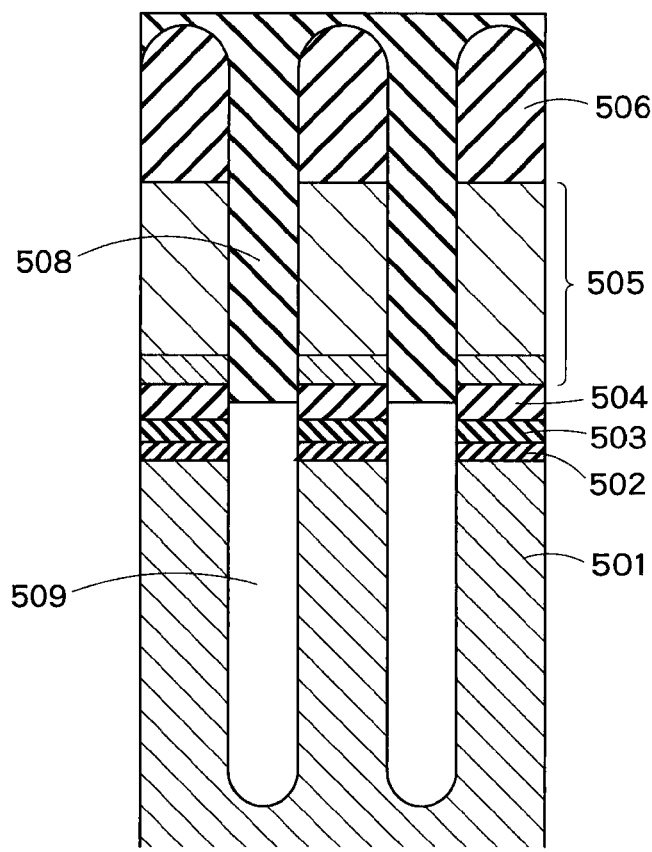
F I G. 13
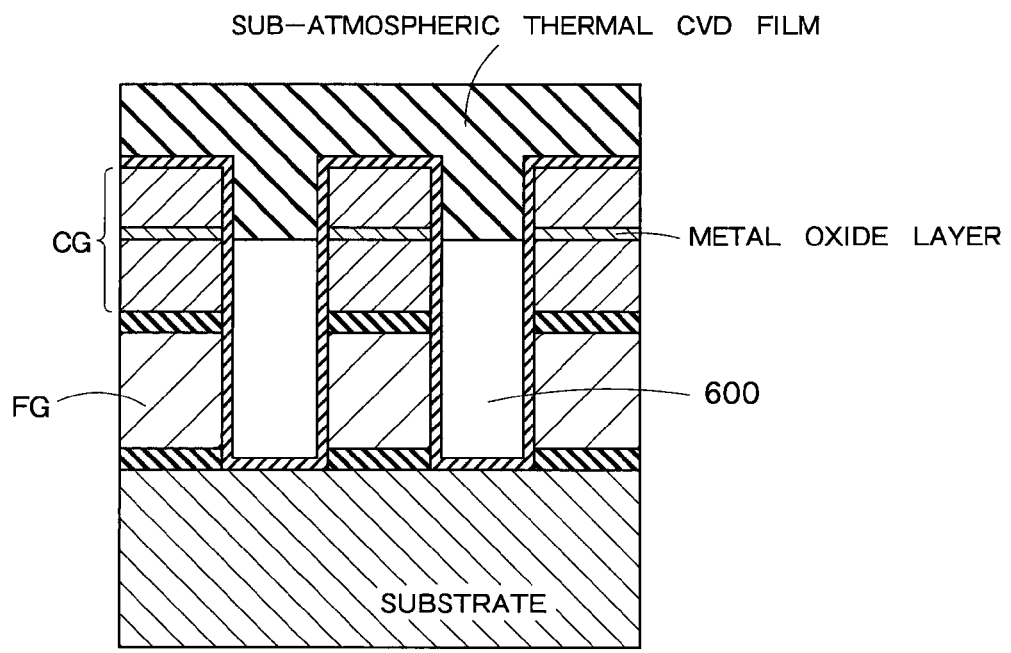
F I G. 14

SEMICONDUCTOR MEMORY DEVICE AND METHOD FOR MANUFACTURING THE SAME

CROSS REFERENCE TO RELATED APPLICATIONS

This application is based upon and claims the benefit of priority from the Japanese Patent Application No. 2008-44481, filed on Feb. 26, 2008, the entire contents of which are incorporated herein by reference.

BACKGROUND OF THE INVENTION

The present invention relates to a semiconductor memory device and a method for manufacturing the same.

In conventional nonvolatile semiconductor memory devices, a place between word lines thereof is filled in with an oxide or nitride film, the word line having a tunnel oxide film, a floating gate electrode, an interpoly insulating film, and a controlling gate electrode which are stacked in order. However, an interval between word lines is shorten as elements are miniaturized, and therefore the conventional devices have problems as follows: increased variations in a threshold voltage of its floating gate due to a parasitic capacitance produced between the floating gate electrodes of adjacent word lines thereof; and reduced writing speed due to parasitic capacitances produced between the adjacent word lines and between the floating gate and diffusion layer. Moreover, it has a problem that a high electric field applied between the electrodes destroys a buried material between the electrodes.

In order to solve such problems, it has been proposed to provide an air gap (a cavity) between word lines. For example, known is a method for forming an air gap by conducting an ashing process to remove a sacrificial film with organic materials as a sacrificial film (e.g. see Japanese Patent Laid-Open No. 01-137651). However, the method has a problem that, when such a method is applied to formation of an air gap between word lines, carbons and the like contained in organic materials causes the tunnel oxide film to be deteriorated.

Also, known is a method for stacking an oxide film with poor filling-in characteristics on word lines and between the word lines and then providing a void between adjacent floating gate electrodes (e.g. see U.S. Patent Application Publication No. 2006/0001073). However, such a method has problems that variations in position and shape of the voids occur as well as variations in a threshold voltage for each cell occur, thereby decreasing reliability thereof.

Thus, the conventional method for forming an air gap has the problems of decreasing reliability of a semiconductor memory device.

SUMMARY OF THE INVENTION

According to one aspect of the present invention, there is provided a semiconductor memory device, comprising:
a semiconductor substrate;
a plurality of word lines formed at predetermined intervals on the semiconductor substrate, each word line having a gate insulating film, a charge storage layer, a first insulating film, and a controlling gate electrode which are stacked in order, and including a metal oxide layer above the level of the gate insulating film;
a second insulating film covering a side of the word line and a surface of the semiconductor substrate between the word lines, and having a film thickness of 15 nm or less; and
a third insulating film formed between the word lines adjacent to each other such that a region below the level of the metal oxide layer has a cavity.

According to one aspect of the present invention, there is provided a method for manufacturing a semiconductor memory device, comprising:
forming a plurality of word lines at predetermined intervals on a semiconductor substrate, each having a gate insulating film, a charge storage layer, a first insulating film, and a controlling gate electrode which are stacked in order, and including a metal oxide layer above the level of the gate insulating film;
forming a second insulating film having a film thickness of 15 nm or less so as to cover a side of the word line and a surface of the semiconductor substrate between the word lines; and
forming a third insulating film so as to cover the word lines and a place between the word lines using a CVD technique.

According to one aspect of the present invention, there is provided a method for manufacturing a semiconductor memory device, comprising:
forming a first insulating film on a semiconductor substrate;
forming a first electrode layer on the first insulating film;
forming a trench formed at predetermined intervals along a first direction by etching the first electrode layer, the first insulating film, and the semiconductor substrate;
forming an element isolating insulating film so as to fill in the trench;
forming a second insulating film including a metal oxide layer on the first electrode layer and the element isolating insulating film;
forming a second electrode layer on the second insulating film;
forming a third insulating film on the second electrode layer;
forming word lines formed at predetermined intervals along a second direction perpendicular to the first direction by removing the third insulating film, the second electrode layer, the second insulating film, the first electrode layer, the first insulating film, and the element isolating insulating film so as to expose a surface of the semiconductor substrate;
forming a fourth insulating layer having a film thickness of 15 nm or less on a side of the word line and the surface of the semiconductor substrate between the word lines; and
forming a fifth insulating film using a CVD technique so as to cover the word line and a place between the word lines.

BRIEF DESCRIPTION OF THE DRAWINGS

FIG. 1 is a cross sectional view of a process for explaining a method for manufacturing a semiconductor memory device according to a first embodiment of the present invention;
FIG. 2 is a cross sectional view subsequent to FIG. 1;
FIG. 8 is a cross sectional view subsequent to FIG. 7.

FIG. 13 is a cross sectional view subsequent to FIG. 12; and

FIG. 14 is a schematic view of a semiconductor memory device according to a modification.

DESCRIPTION OF THE INVENTION

Embodiments of the present invention will be described below with reference to drawings.

First Embodiment

Figure 3:
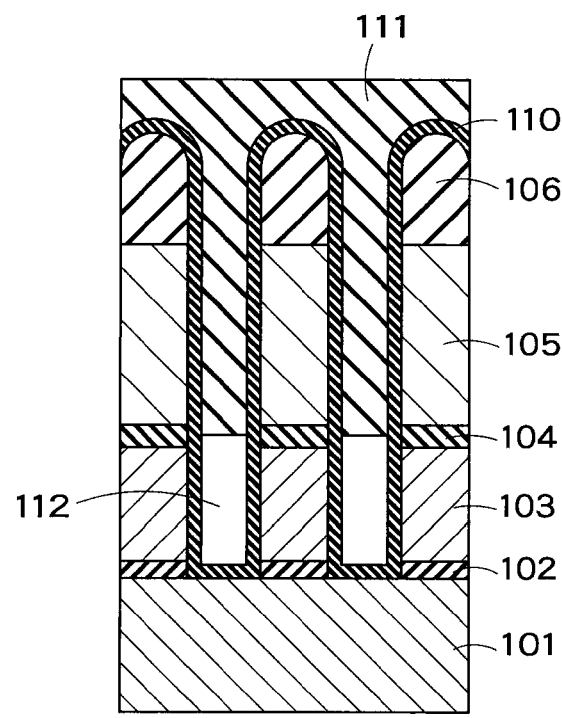
FIG. 3 is a cross sectional view subsequent to FIG. 2.

FIGS. 1 to 3 show cross sectional views of a process for explaining a method for manufacturing a semiconductor memory device according to a first embodiment of the present invention. Each view shows a vertical section along the direction of bit line in a memory cell array.

As shown in FIG. 1, a tunnel oxide film (a gate insulating film) 102 composed of a silicon oxide film and a floating gate electrode 103 composed of a polysilicon film are formed on a semiconductor substrate 101.

A trench (not shown) is formed at predetermined intervals along a predetermined direction (the direction of bit line) by removing the floating gate electrode 103, the tunnel oxide film 102, and the semiconductor substrate 101. The trench is filled in with a silicon oxide film to a predetermined height to form an element isolating region (not shown). An upper surface of the element isolating region may be lower than an upper surface of the floating gate electrode 103.

An interpoly insulating film 104 is formed so as to cover the floating gate electrode 103 and the element isolating region. The interpoly insulating film 104 includes a metal oxide. As the metal oxide, for example, a Zr-based oxide such as $ZrO_2$, $PbZrO_2$, and $BaZrO_3$; a Hf-based oxide such as $HfO_2$, HfON, and HfAlO; a La-based oxide such as $LaO_3$; an Al-based oxide such as $Al_2O_3$ and $AlZrO_5$; a Ta-based oxide such as $Ta_2O_5$; a Ti-based oxide such as $TiO_2$; and/or an Y-based oxide such as $Y_2O_3$ may be used.

The interpoly insulating film 104, for example, may be a structure with a nitride film/an oxide film/a metal oxide/an oxide film/a nitride film stacked.

A first polysilicon film is formed on the interpoly insulating film 104. A groove is formed by removing a part of the first polysilicon film and the interpoly insulating film 104 in a region where a selection transistor and a peripheral transistor (both are not shown) will be formed. A second polysilicon film is formed on the first polysilicon film so as to fill in the groove.

In the memory cell array, a controlling gate electrode 105 is composed of the first polysilicon film and the second polysilicon film. In the selection gate transistor and the peripheral transistor, each has an etching interpoly structure in which the polysilicon films (electrode layers) above and below the interpoly insulating film 104 are connected.

A silicon nitride film 106, then, is formed on the controlling gate electrode 105. Subsequently, resists 107 are formed on the silicon nitride film 106 and a patterning is performed so as to be formed in strips along a direction (the direction of word line) perpendicular to the above predetermined direction at predetermined intervals.

As shown in FIG. 2, the silicon nitride film 106 is etched using RIE (reactive ion etching) process with the resist 107 as a mask. Then, the resist 107 is removed. Following this, the controlling gate electrode 105, the interpoly insulating film 104, the floating gate electrode 103, and the tunnel oxide film 102 are removed using RIE with the silicon nitride film 106 as a mask to fabricate word lines WL and selection transistors (not shown). At this time, a part of the element isolating region (not shown) is also removed.

The word lines WL each have the tunnel oxide film 102, the floating gate electrode 103, the interpoly insulating film 104, and the controlling gate electrode 105 which are stacked in order. In one word line WL, the tunnel oxide film 102 and the floating gate electrode 103, and the element isolating region (not shown) are alternately formed, as well as the interpoly insulating film 104 is formed in a strip on the floating gate electrode 103 and the element isolating region.

Subsequently, a silicon oxynitride film 110 is formed using an ALD (Atomic Layer Deposition) technique so as to cover the word lines WL and the semiconductor substrate 101. The silicon oxynitride film 110 is made to have a film thickness of 15 nm or less. In order to prevent surface leakage, it is necessary to make sure to form an oxide film or the like so as to cover the word lines. Because of this, the silicon oxynitride film 110 is formed.

As shown in FIG. 3, a sub-atmospheric thermal CVD (Chemical Vapor Deposition) film 111 is formed. The sub-atmospheric thermal CVD film 111 is formed e.g. in the presence of TEOS (tetraethoxysilane: $Si(OC_2H_5)_4$), $O_3$, and $H_2O$ gas in a temperature range of 380 to 480° C. and a pressure range of 500 to 650 Torr.

The interpoly insulating film 104 includes a metal oxide. In the vicinity of this metal oxide, dissociative adsorption of oxygen molecules occurs, and thus activated oxygens promote reaction. This phenomenon is also referred to as catalytic effect.

This catalytic effect promotes chemical reaction (TEOS oxidation) of the sub-atmospheric thermal CVD film 111. In other words, in a location of the interpoly insulating film 104 including the metal oxide, the CVD film 111 is rapidly grown, and a place between the word lines WL is occluded before its lower potion being filled in.

Therefore, a place between the word lines WL below the interpoly insulating film 104, i.e. a place between the floating gate electrodes 103 is not filled in, and thus a cavity 112 is formed.

Though the silicon oxynitride film 110 is on a side of the interpoly insulating film 104, the silicon oxynitride film 110 has a film thickness of 15 nm or less, and therefore the catalytic effect of the metal oxide included in the interpoly insulating film 104 may influence the growth of the CVD film 111.

The cavity part provided between the floating gate electrodes 103 allows a parasitic capacitance between the floating gate electrodes 103 to be reduced to improve its operating speed.

Moreover, the catalytic effect of the metal oxide included in the interpoly insulating film 104 facilitate the growth of the CVD film 111 to form the cavity 112, and therefore variations produced in position and shape of the respective cavity 112 between the word lines WL can be minimized. Accordingly, the occurrence of variations in a threshold voltage for each cell can be prevented, and a reliable semiconductor memory device is obtained.

Second Embodiment

Figure 4:
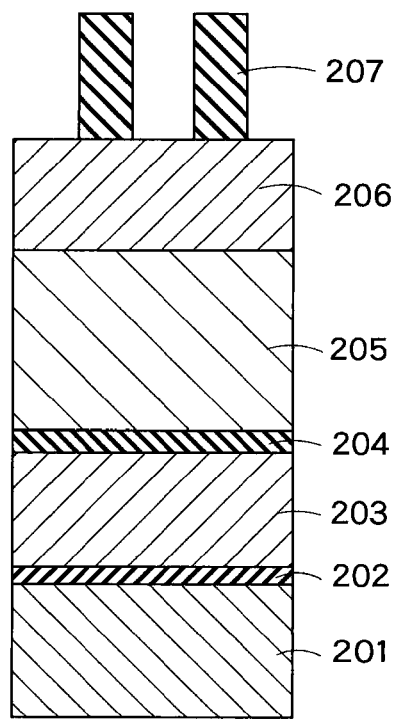
FIG. 4 is a cross sectional view of a process for explaining a method for manufacturing a semiconductor memory device according to a second embodiment of the present invention.
Figure 5:
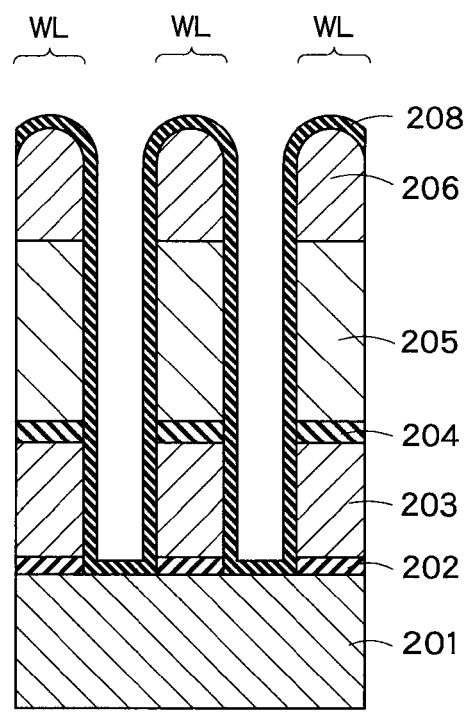
FIG. 5 is a cross sectional view subsequent to FIG. 4.
Figure 6:
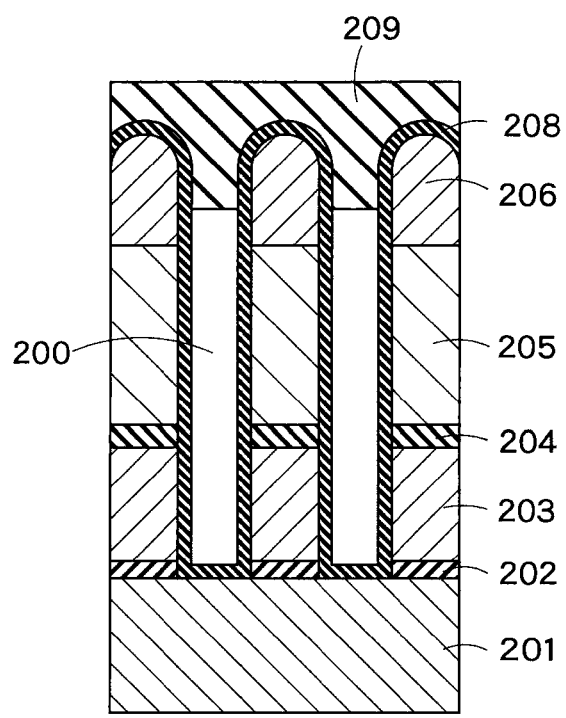
FIG. 6 is a cross sectional view subsequent to FIG. 5.

FIGS. 4 to 6 show cross sectional views of a process for explaining a method for manufacturing a semiconductor memory device according to a second embodiment of the present invention. Each view shows a vertical section along the direction of bit line in a memory cell array.

As shown in FIG. 4, a tunnel oxide film 202 composed of a silicon oxide film, and a floating gate electrode 203 composed of a polysilicon film are formed on a semiconductor substrate 201.

A trench (not shown) is formed at predetermined intervals along a predetermined direction (the direction of bit line) by removing the floating gate electrode 203, the tunnel oxide film 202, and the semiconductor substrate 201. The trench is filled in with a silicon oxide film to a predetermined height to form an element isolating region (not shown).

An interpoly insulating film 204 is formed so as to cover the floating gate electrode 203 and the element isolating region.

A first polysilicon film is formed on the interpoly insulating film 204. A groove is formed by removing a part of the first polysilicon film and the interpoly insulating film 204 in a region where a selection transistor and a peripheral transistor (both are not shown) will be formed. A second polysilicon film is formed on the first polysilicon film so as to fill in the groove.

In the memory cell array, a controlling gate electrode 205 is composed of the first polysilicon film and the second polysilicon film. In the selection gate transistor and the peripheral transistor, the controlling gate electrode 205 has an etching interpoly structure in which the polysilicon films (electrode layers) above and below the interpoly insulating film 204 are connected.

A metal oxide film 206 is formed on the controlling gate electrode 205 using the ALD technique. As the metal oxide, for example, a Zr-based oxide such as $ZrO_2$, $PbZrO_2$, and $BaZrO_3$; a Hf-based oxide such as $HfO_2$, HfON, and HfAlO; a La-based oxide such as $LaO_3$; an Al-based oxide such as $Al_2O_3$ and $AlZrO_5$; a Ta-based oxide such as $Ta_2O_5$; a Ti-based oxide such as $TiO_2$; and/or an Y-based oxide such as $Y_2O_3$ may be used.

Subsequently, resists 207 are formed on the metal oxide film 206 and a patterning is performed so as to be formed in strips along a direction (the direction of word line) perpendicular to the above predetermined direction at predetermined intervals.

As shown in FIG. 5, the metal oxide film 206, the controlling gate electrode 205, the interpoly insulating film 204, the floating gate electrode 203, and the tunnel oxide film 202 are removed using RIE with the resist 207 as a mask to fabricate word lines WL and selection transistors (not shown). Then, the resists 207 are removed.

Subsequently, a silicon oxynitride film 208 is formed using the ALD (Atomic Layer Deposition) technique so as to cover the word lines WL and the semiconductor substrate 201. The silicon oxynitride film 208 is made to have a film thickness of 15 nm or less. The silicon oxynitride film 208 is necessarily formed for preventing surface leakage.

As shown in FIG. 6, a sub-atmospheric thermal CVD film 209 is formed. The sub-atmospheric thermal CVD film 209 is formed e.g. in the presence of TEOS, $O_3$, and $H_2O$ gas in a temperature range of 380° C. to 480° C. and a pressure range of 500 to 650 Torr.

The catalytic effect of the metal oxide included in the metal oxide film 206 promotes chemical reaction (TEOS oxidation) of the sub-atmospheric thermal CVD film 209. In other words, in a location of the metal oxide film 206, the CVD film 209 is rapidly grown.

Therefore, a place between the word lines WL below the metal oxide film 206, i.e. a place between the controlling gate electrodes 205 and a place between the floating gate electrodes 203 is not filled in, and thus a cavity 200 is formed.

Though the metal oxide film 206 is covered with the silicon oxynitride film 208, the film 208 has a film thickness of 15 nm or less, and therefore the catalytic effect of the metal oxide may influence the growth of the CVD film 209.

The cavity part provided between the floating gate electrodes 203 allows a parasitic capacitance between the floating gate electrodes 203 to be reduced to improve its operating speed.

The cavity part also exists between the controlling gate electrodes 205, and therefore a resistance to pressure with respect to a high electric field applied between electrodes is improved, and this makes the semiconductor memory device reliable.

Moreover, the catalytic effect of the metal oxide film 206 promotes the growth of the CVD film 209 to form the cavity 200, and therefore variations produced in position and shape of the respective cavity 200 between the word lines WL can be minimized. Accordingly, the occurrence of variations in a threshold voltage for each cell can be prevented, and this makes the semiconductor memory device reliable.

Third Embodiment

Figure 7:
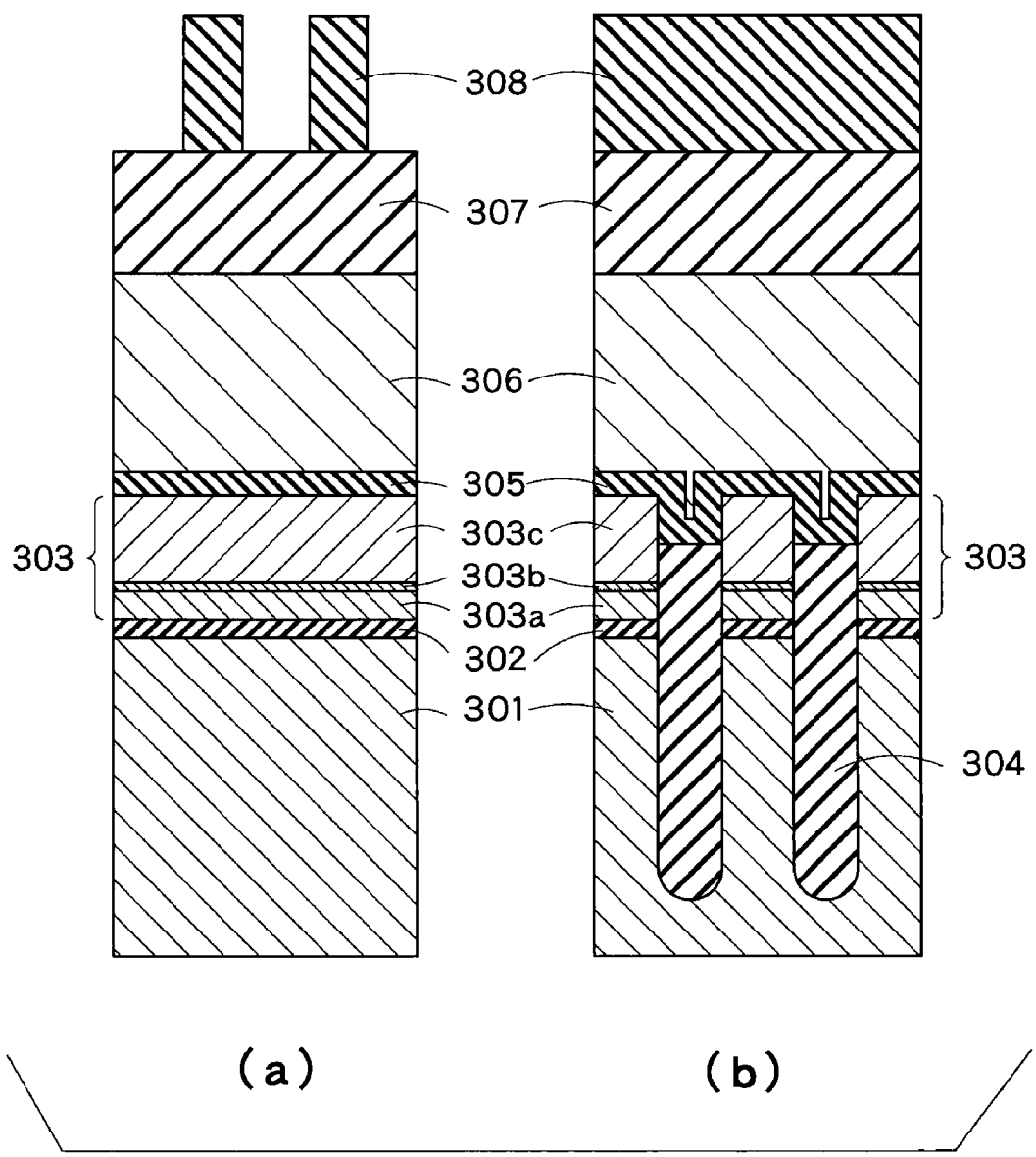
FIG. 7 is a cross sectional view of a process for explaining a method for manufacturing a semiconductor memory device according to a third embodiment of the present invention.
Figure 9:
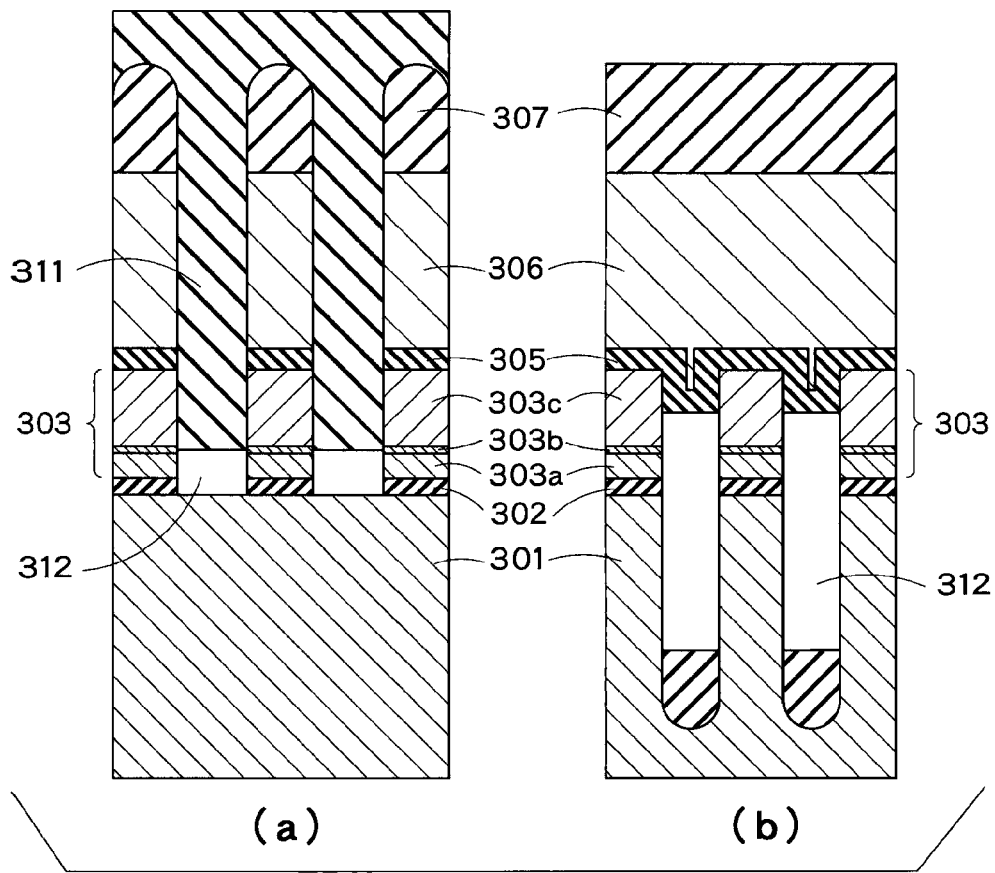
FIG. 9 is a cross sectional view subsequent to FIG. 8.

FIGS. 7 to 9 show a cross sectional view of a process for explaining a method for manufacturing a semiconductor memory device according to a third embodiment of the present invention. In each view, reference characters (a) show a vertical section of a memory cell array along the direction of bit line, and reference characters (b) show a vertical section along the direction of word line.

As shown in FIG. 7, a tunnel oxide film 302 composed of a silicon oxide film is formed on a semiconductor substrate 301, and a floating gate electrode 303 having a stacking structure with a polysilicon film 303a, a metal oxide layer 303b, and a polysilicon film 303c is formed on the tunnel oxide film 302.

As the metal oxide layer 303b, for example, a Zr-based oxide such as $ZrO_2$, $PbZrO_2$, and $BaZrO_3$; a Hf-based oxide such as $HfO_2$, HfON, and HfAlO; a La-based oxide such as $LaO_3$; an Al-based oxide such as $Al_2O_3$ and $AlZrO_5$; a Ta-based oxide such as $Ta_2O_5$; a Ti-based oxide such as $TiO_2$; and/or an Y-based oxide such as $Y_2O_3$ as the metal oxide may be used.

A trench is formed at predetermined intervals along the direction of bit line by removing the floating gate electrode 303, the tunnel oxide film 302, and the semiconductor substrate 301. The trench is filled in with a silicon oxide film to a predetermined height to form an element isolating region 304 whose upper surface is lower than an upper surface of the floating gate electrode 303.

An interpoly insulating film 305 is formed so as to cover the floating gate electrode 303 and the element isolating region 304.

A first polysilicon film is formed on the interpoly insulating film 305. A groove is formed by removing a part of the first polysilicon film and the interpoly insulating film 305 in a region where a selection transistor and a peripheral transistor (both are not shown) will be formed. A second polysilicon film is formed on the first polysilicon film so as to fill in the groove.

In the memory cell array, a controlling gate electrode 306 is composed of the first polysilicon film and the second polysilicon film. In the selection gate transistor and the peripheral transistor, the controlling gate electrode 306 has an etching interpoly structure in which the polysilicon films (electrode layers) above and below the interpoly insulating film 305 are connected.

A silicon nitride film 307, then, is formed on the controlling gate electrode 306. Subsequently, resists 308 are formed on the silicon nitride film 307 and a patterning is performed so as to be formed in strips along the direction of word line at predetermined intervals.

As shown in FIG. 8, the silicon nitride film 307 is etched using RIE (reactive ion etching) process with the resist 308 as a mask. Then, the resist 308 is removed. Following this, the controlling gate electrode 306, the interpoly insulating film 305, the floating gate electrode 303, and the tunnel oxide film 302 are removed using RIE with the silicon nitride film 307 as a mask to fabricate word lines WL and selection transistors (not shown). Further, an oxide film (not shown) for preventing surface leakage is formed so as to cover the word lines WL.

As shown in FIG. 9, a part of the silicon oxide film in the element isolating region 304 is removed with wet etching.

Subsequently, a sub-atmospheric thermal CVD film 311 is formed. The sub-atmospheric thermal CVD film 311 is formed e.g. in the presence of TEOS, $O_3$, and $H_2O$ gas in a temperature range of 380° C. to 480° C. and a pressure range of 500 to 650 Torr.

The floating gate electrode 303 includes a metal oxide layer 303b. The catalytic effect of this metal oxide promotes chemical reaction (TEOS oxidation) of the sub-atmospheric thermal CVD film 311. In other words, in a location of the metal oxide layer 303b, the CVD film 311 is rapidly grown.

Therefore, a place between the word lines WL below the metal oxide layer 303b, i.e. a lower portion between the floating gate electrodes 303 is not filled in, and thus a cavity 312 is formed.

The cavity part provided between the floating gate electrodes 303 allows a parasitic capacitance between the floating gate electrodes 303 to be reduced to improve its operating speed. A cavity is also formed in the element isolating region, and therefore a parasitic capacitance produced between the floating gate electrode and the substrate can also be reduced.

Moreover, the catalytic effect of the metal oxide layer 303b facilitates the growth of the CVD film 311 to form the cavity 312, and therefore variations produced in position and shape of the respective cavity 312 between the word lines WL can be minimized. Accordingly, the occurrence of variations in a threshold voltage for each cell is prevented, and this makes a semiconductor memory device reliable.

Though the semiconductor memory device according to the above embodiment has a stack-gate memory cell structure of a controlling gate electrode/an interpoly insulating film/a floating gate electrode/a tunnel oxide film, the present invention can be applied to a MONOS structure as well.

Figure 10:
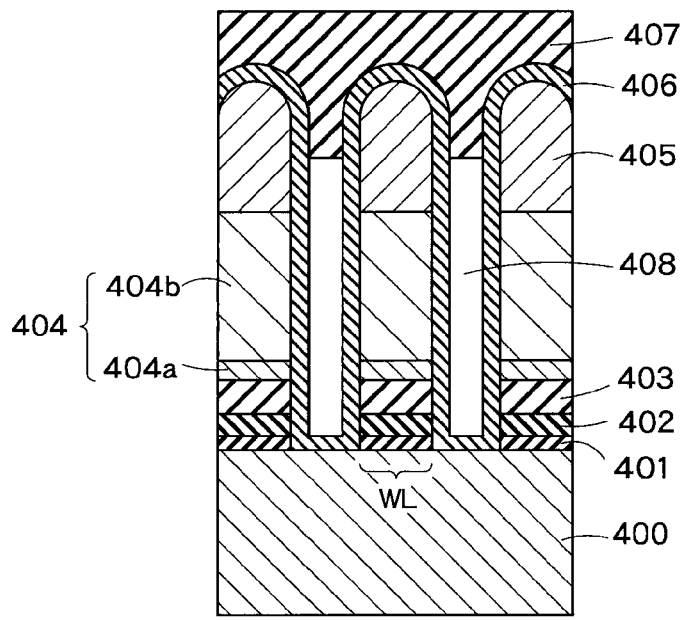
FIG. 10 is a schematic view of a semiconductor memory device according to a modification.

In the case where the method for forming an air gap (a cavity) according to the above second embodiment is applied to a MONOS structure, a semiconductor memory device as shown in FIG. 10 is obtained.

A word line WL has a tunnel oxide film 401, a trap nitride film 402, an interpoly insulating film (a high dielectric film) 403, a controlling gate electrode 404, and a metal oxide film 405 which are stacked in order on a semiconductor substrate 400. The controlling gate electrode 404 includes a metal film 404a and a polysilicon film 404b.

A silicon oxynitride film 406 for preventing surface leakage is formed with a film thickness of 15 nm or less so as to cover the word lines WL and the semiconductor substrate between the word lines WL.

As described in the above embodiments, the catalytic effect of a metal oxide included in the metal oxide film 405 promotes chemical reaction (TEOS oxidation) of a sub-atmospheric thermal CVD film 407. In other words, in a location of the metal oxide film 405, the CVD film 407 is rapidly grown, and a place between the word lines WL below the metal oxide film 405 is not filled in, resulting in a formation of a cavity 408.

With a semiconductor memory device with such a MONOS structure, as with the above second embodiment, its operating speed and its resistance to pressure with respect to a high electric field is improved, this makes it reliable.

Figure 11:
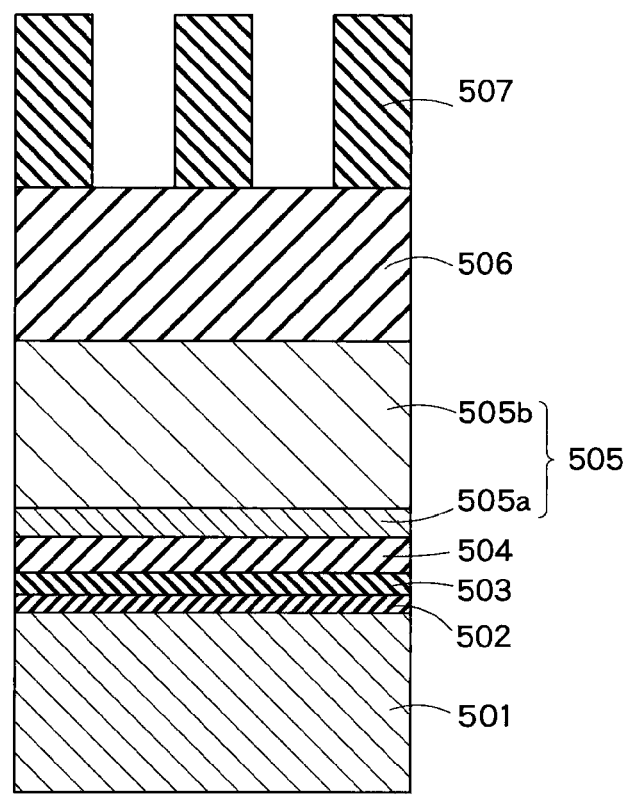
FIG. 11 is a cross sectional view of a process for explaining a method for manufacturing a semiconductor memory device according to a modification.

Also, forming an element isolating region of the semiconductor memory device with the MONOS structure into a cavity, by way of example, is described with reference to FIGS. 11 to 13. As shown in FIG. 11, a tunnel oxide film 502, a trap nitride film 503, a block film 504 including a metal oxide (e.g. alumina), a controlling gate electrode 505 composed of a metal (e.g. TiN) film 505a and a polysilicon film 505b, and a silicon nitride film 506 are formed in order on a semiconductor substrate 501. Then, resists 507 are formed on the silicon nitride film 506 and lithographic processing is performed so as to be formed in a strip at predetermined intervals along the direction of bit line.

Figure 12:
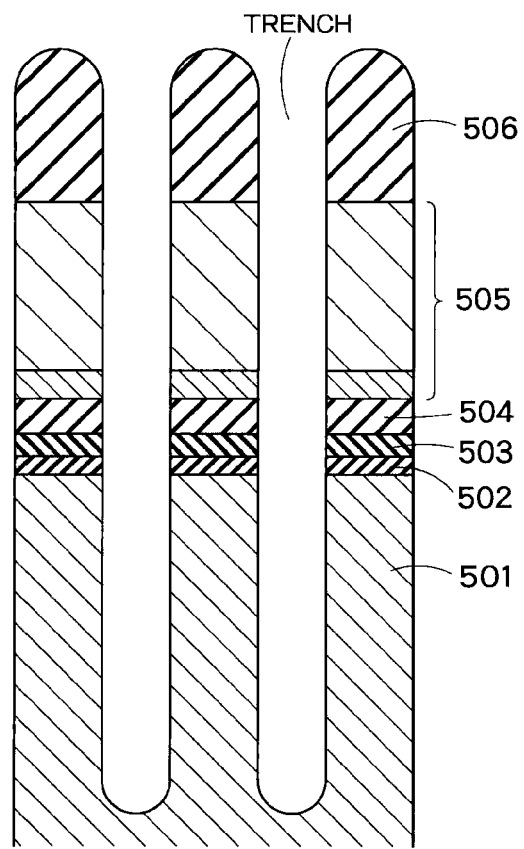
FIG. 12 is a cross sectional view subsequent to FIG. 11.

As shown in FIG. 12, the silicon nitride film 506 is etched using RIE process with the resist 507 as a mask, and the resist 507 is separated. Then, the controlling gate electrode 505, the block film 504, the trap nitride film 503, the tunnel oxide film 502, and the semiconductor substrate 501 are etched using RIE process with the silicon nitride film 506 as a mask to form a trench.

As shown in FIG. 13, a sub-atmospheric thermal CVD film 508 is formed. The block film 504 includes a metal oxide. The catalytic effect of the metal oxide promotes chemical reaction (TEOS oxidation) of the sub-atmospheric thermal CVD film 508. In other words, in a location of the block film 504, the CVD film 508 is rapidly grown. Therefore, the trench located below the block film 504 is not filled in, and thus a cavity 509 is formed. The element isolating region thus may be formed into a cavity.

Moreover, in the above third embodiment, the metal oxide layer is formed in the floating gate electrode, and however, as shown in FIG. 14, it may be designed to be formed in a controlling gate electrode CG. The controlling gate electrode CG has a stacking structure of a first controlling gate electrode film, a metal oxide film, and a second controlling gate electrode film. Between adjacent word lines WL, this forms a cavity 600 between floating gate electrodes FG and between lower portions of the controlling gate electrodes CG (the first controlling gate electrode films).

What is claimed is:

1. A method for manufacturing a semiconductor memory device, comprising:
   forming a plurality of word lines at predetermined intervals on a semiconductor substrate, each having a gate insulating film, a charge storage layer, a first insulating film, and a controlling gate electrode which are stacked in order, and including a metal oxide layer above the level of the gate insulating film;
   forming a second insulating film having a film thickness of 15 nm or less so as to cover a side of the word line and a surface of the semiconductor substrate between the word lines; and
   forming a third insulating film between the word lines using a CVD technique so as to make a cavity in a region between the word lines below a level of the metal oxide layer by a catalytic effect of a metal oxide included in the metal oxide layer.

2. The method for manufacturing the semiconductor memory device according to claim 1, wherein the first insulating film is formed so as to include the metal oxide layer.

3. The method for manufacturing the semiconductor memory device according to claim 2, wherein the first insulating film is formed by:
stacking a first nitride film on the charge storage layer;
stacking a first oxide film on the first nitride film;
stacking the metal oxide layer on the first oxide film;
stacking a second oxide film on the metal oxide layer; and
stacking a second nitride film on the second oxide film.

4. The method for manufacturing the semiconductor memory device according to claim 1, wherein the metal oxide layer is formed on the controlling gate electrode.

5. The method for manufacturing the semiconductor memory device according to claim 1, wherein the controlling gate electrode is formed by:
stacking a first controlling gate electrode film on the first insulating film;
stacking the metal oxide layer on the first controlling gate electrode film; and
stacking a second controlling gate electrode film on the metal oxide layer.

6. The method for manufacturing the semiconductor memory device according to claim 1, wherein the charge storage layer is formed by:
stacking a first charge storage film on the gate insulating film;
stacking the metal oxide layer on the first charge storage film; and
stacking a second charge storage film on the metal oxide layer.

7. The method for manufacturing the semiconductor memory device according to claim 1, wherein the second insulating film is a silicon oxynitride film.

8. The method for manufacturing the semiconductor memory device according to claim 1, wherein the metal oxide layer includes at least any one of $ZrO_2$, $PbZrO_2$, $BaZrO_3$, $HfO_2$, HfON, HfAl, $LaO_3$, $Al_2O_3$, $AlZrO_5$, $Ta_2O_5$, $TiO_2$, and $Y_2O_3$.

9. A method for manufacturing a semiconductor memory device, comprising:
forming a first insulating film on a semiconductor substrate;
forming a first electrode layer on the first insulating film;
forming a trench formed at predetermined intervals along a first direction by etching the first electrode layer, the first insulating film, and the semiconductor substrate;
forming an element isolating insulating film so as to fill in the trench;
forming a second insulating film including a metal oxide layer on the first electrode layer and the element isolating insulating film;
forming a second electrode layer on the second insulating film;
forming a third insulating film on the second electrode layer;
forming word lines formed at predetermined intervals along a second direction perpendicular to the first direction by removing the third insulating film, the second electrode layer, the second insulating film, the first electrode layer, the first insulating film, and the element isolating insulating film so as to expose a surface of the semiconductor substrate;
forming a fourth insulating layer having a film thickness of 15 nm or less on a side of the word line and the surface of the semiconductor substrate between the word lines; and
forming a fifth insulating film between the word lines using a CVD technique so as to make a cavity in a region between the word lines below a level of the metal oxide layer by a catalytic effect of a metal oxide included in the metal oxide layer.

* * * * *